United States Patent

(12) United States Patent
Liu

(10) Patent No.: US 11,483,434 B2
(45) Date of Patent: *Oct. 25, 2022

(54) METHOD AND APPARATUS FOR ADJUSTING VOLUME OF USER TERMINAL, AND TERMINAL

(71) Applicant: Huawei Technologies Co., Ltd., Shenzhen (CN)

(72) Inventor: Dong Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/325,918

(22) Filed: May 20, 2021

(65) Prior Publication Data

US 2021/0274049 A1 Sep. 2, 2021

Related U.S. Application Data

(63) Continuation of application No. 16/735,926, filed on Jan. 7, 2020, now Pat. No. 11,044,369, which is a continuation of application No. 16/230,060, filed on Dec. 21, 2018, now Pat. No. 10,554,826, which is a continuation of application No. 15/825,911, filed on (Continued)

(30) Foreign Application Priority Data

Apr. 16, 2014 (CN) .......................... 201410152521.9

(51) Int. Cl.
H04M 19/04 (2006.01)
H04M 1/725 (2021.01)
H04M 1/72454 (2021.01)
G10L 21/0232 (2013.01)
(Continued)

(52) U.S. Cl.
CPC ....... *H04M 19/044* (2013.01); *G10L 21/0232* (2013.01); *H03G 3/32* (2013.01); *H04M 1/725* (2013.01); *H04M 1/72454* (2021.01); *H04W 88/02* (2013.01)

(58) Field of Classification Search
CPC ....................... H04M 19/044; H04M 1/72454
See application file for complete search history.

(56) References Cited

U.S. PATENT DOCUMENTS 7,469,155 B2 * 12/2008 Chu .................. H04M 1/72463
455/567
2003/0008687 A1 1/2003 Nishimura
(Continued)

FOREIGN PATENT DOCUMENTS

CN 1507293 A 6/2004
CN 1783892 A 6/2006
(Continued)

*Primary Examiner* — Tuan H Nguyen
(74) *Attorney, Agent, or Firm* — Conley Rose, P.C.

(57) ABSTRACT

A volume adjustment method includes performing analysis on the collected sound signal surrounding a user terminal to obtain composition information, where the composition information includes sound types included in the sound signal and proportions of sounds of the various types, and the sound types include blank sound, human sound, and noise, determining a current scene mode of the user terminal according to the composition information, and adjusting volume of the user terminal according to the determined scene mode.

20 Claims, 6 Drawing Sheets

Related U.S. Application Data

Nov. 29, 2017, now Pat. No. 10,200,545, which is a continuation of application No. 15/293,372, filed on Oct. 14, 2016, now Pat. No. 9,866,707, which is a continuation of application No. PCT/CN2015/072906, filed on Feb. 12, 2015.

(51) Int. Cl.
*H03G 3/32* (2006.01)
*H04W 88/02* (2009.01)

(56) References Cited

U.S. PATENT DOCUMENTS

| | | |
|---|---|---|
| 2004/0127197 A1 | 7/2004 | Roskind |
| 2005/0026568 A1 | 2/2005 | Hawker et al. |
| 2005/0282590 A1 | 12/2005 | Haparnas |
| 2006/0116175 A1 | 6/2006 | Chu |
| 2007/0121917 A1 | 5/2007 | Ho et al. |
| 2010/0167795 A1 | 7/2010 | Huang |
| 2010/0273522 A1 | 10/2010 | Ota et al. |
| 2013/0143543 A1* | 6/2013 | Vepa ............ H04W 8/183 455/418 |
| 2013/0210410 A1 | 8/2013 | Xu |

FOREIGN PATENT DOCUMENTS

| | | |
|---|---|---|
| CN | 101076949 A | 11/2007 |
| CN | 101304455 A | 11/2008 |
| CN | 101771390 A | 7/2010 |
| CN | 103002106 A | 3/2013 |
| CN | 103139351 A | 6/2013 |
| CN | 103618835 A | 3/2014 |
| CN | 103945062 A | 7/2014 |
| DE | 20000409 U1 | 5/2000 |
| JP | H10136058 A | 5/1998 |
| JP | 2001223767 A | 8/2001 |
| JP | 2003023474 A | 1/2003 |
| JP | 2010258687 A | 11/2010 |
| KR | 19990026882 A | 9/1997 |
| KR | 20130062228 A | 6/2013 |
| TW | 201327371 A | 7/2013 |
| TW | 201334495 A | 8/2013 |
| WO | 0059110 A2 | 10/2000 |

\* cited by examiner

METHOD AND APPARATUS FOR ADJUSTING VOLUME OF USER TERMINAL, AND TERMINAL

CROSS-REFERENCE TO RELATED APPLICATIONS

This application is a continuation of U.S. patent application Ser. No. 16/735,926, filed on Jan. 7, 2020, which is a continuation of U.S. patent application Ser. No. 16/230,060, filed on Dec. 21, 2018, now U.S. Pat. No. 10,554,826, which is a continuation of U.S. patent application Ser. No. 15/825,911, filed on Nov. 29, 2017, now U.S. Pat. No. 10,200,545, which is a continuation of U.S. patent application Ser. No. 15/293,372, filed on Oct. 14, 2016, now U.S. Pat. No. 9,866,707, which is a continuation of International Patent Application No. PCT/CN2015/072906, filed on Feb. 12, 2015, which claims priority to Chinese Patent Application No. 201410152521.9, filed on Apr. 16, 2014. All of the aforementioned patent applications are hereby incorporated by reference in their entireties.

TECHNICAL FIELD

The present disclosure relates to the field of communications technologies, and in particular, to a method and an apparatus for adjusting volume of a user terminal, and a terminal.

BACKGROUND

With continuous development of communications technologies, portable user terminals, for example, mobile phones or tablet computers, have become an indispensable personal belonging in people's life and work. People may make a call or answer a call anytime anywhere. When a call is answered, different ring tone volume usually needs to be set according to different occasions. A mobile phone user usually wants to use a ring tone with relatively low volume in a quiet environment such as an office, so as to avoid generating a relatively high sound that affects normal work of other office staff. However, in a noisy public place such as a shopping mall or a station, a ring tone with relatively high volume is required, so as to ensure that an incoming call can be answered in time.

A ring tone volume of most mobile phones and conversation volume of an earpiece are usually manually adjusted by a user, or most mobile phones integrate a simple self-sensing scene mode such as a specific scenario like an indoor mode or an outdoor mode.

When the self-sensing scene mode is used to adjust play volume of a ring tone of a mobile phone, a decibels of an environment sound is generally extracted and determined using a sound detecting module when a call is incoming, and then ring tone volume and earpiece volume are adjusted according to a pre-stored correspondence between sound decibel quantities and ring tone volumes of an incoming call. In the foregoing volume adjustment manner, final volume of a ring tone and that of an earpiece are determined according to only a decibels of an environment sound, but the decibels of the environment sound cannot accurately reflect a situation in which a user is located, and if an extracted environment sound includes a relatively high human sound, for example, a meeting with a relatively intense discussion, a teach-in, or a launch event, the extracted environment sound may be considered as noise by mistake. In these situations, volume should have been turned down, but volume determined according to the decibels of the environment sound is relatively high. As a result, an adjustment of mobile phone volume does not conform to the real scenario, and the accuracy is not high.

SUMMARY

Embodiments of the present disclosure provide a method and an apparatus for adjusting volume of a user terminal, and a terminal, so that volume of a mobile phone is adaptive and more precisely matches a situation in which a user is located, enhancing user experience.

According to a first aspect, a method for adjusting volume of a user terminal is provided, including collecting a sound signal surrounding the user terminal, performing analysis on the collected sound signal, so as to obtain composition information of the sound signal, where the composition information includes sound types included in the sound signal and proportions of sounds of the various types, and the sound types include blank sound, human sound, and noise, determining a current scene mode of the user terminal according to the composition information of the sound signal, and adjusting the volume of the user terminal according to the determined scene mode.

With reference to the first aspect, in a first possible implementation manner, the collecting a sound signal surrounding the user terminal includes, when it is detected that a call signal arrives, collecting a sound signal of a current environment in which the user terminal is located, or periodically collecting a sound signal of a current environment in which the user terminal is located.

With reference to the first aspect or the first possible implementation manner of the first aspect, in a second possible implementation manner, the adjusting the volume of the user terminal according to the determined scene mode includes determining a volume adjustment coefficient according to the determined scene mode and a pre-stored correspondence between scene modes and volume adjustment coefficients, and adjusting the volume of the user terminal according to the volume adjustment coefficient.

With reference to the second possible implementation manner of the first aspect, in a third possible implementation manner, the volume of the user terminal includes ring tone volume and earpiece volume, the volume adjustment coefficient includes a ring tone volume adjustment coefficient and an earpiece volume adjustment coefficient, and the adjusting the volume of the user terminal according to the volume adjustment coefficient includes adjusting the ring tone volume of the user terminal according to the ring tone volume adjustment coefficient, and adjusting the earpiece volume of the user terminal according to the earpiece volume adjustment coefficient.

With reference to the first aspect, the first possible implementation manner of the first aspect, the second possible implementation manner of the first aspect, or the third possible implementation manner of the first aspect, in a fourth possible implementation manner, after it is detected that the call signal is connected, the method further includes acquiring microphone volume of the user terminal in real time, when the acquired microphone volume is greater than pre-stored reference volume, increasing the earpiece volume of the user terminal, and when the acquired microphone volume is less than the pre-stored reference volume, decreasing the earpiece volume of the user terminal.

With reference to the fourth possible implementation manner of the first aspect, in a fifth possible implementation manner, after it is detected that the call signal is connected, the method further includes periodically collecting the sound signal surrounding the user terminal, and performing analysis on the collected sound signal, so as to obtain the composition information of the sound signal, and determining, according to the composition information of the sound signal, whether the sound signal includes a human sound and includes a sound of only one person, if the sound signal includes a human sound and if the sound signal includes a human sound and includes the sound of the only one person a sound of only one person, calculating volume of the sound signal, obtaining an average value of the calculated volume of the sound signal and the pre-stored reference volume, and storing the average value as a new reference volume.

With reference to the first aspect, the first possible implementation manner of the first aspect, the second possible implementation manner of the first aspect, the third possible implementation manner of the first aspect, the fourth possible implementation manner of the first aspect, or the fifth possible implementation manner of the first aspect, in a sixth possible implementation manner, the performing analysis on the collected sound signal, so as to obtain the composition information of the sound signal includes dividing the collected sound signal into multiple pieces of audio data, calculating a sound frequency of each piece of audio data, and classifying, according to the calculated sound frequency, each piece of audio data according to blank sound, human sound, and noise, collecting statistics on proportions of blank sounds, human sounds, and noise in all pieces of audio data, and for audio data distinguished as a human sound, calculating a mel-frequency cepstral coefficient of audio data of a human sound, and collecting statistics on audio data of a same mel-frequency cepstral coefficient as sounds of one person, so as to determine information about a quantity of people included in the human sound.

With reference to the sixth possible implementation manner of the first aspect, in a seventh possible implementation manner, the classifying, according to the calculated sound frequency, each piece of audio data according to blank sound, human sound, and noise includes determining whether the sound frequency of each piece of audio data is in a range of 20 hertz (Hz) to 20000 Hz, when it is determined that the sound frequency of the audio data is in the range of 20 Hz to 20000 Hz, calculating a fundamental frequency of the audio data, when it is determined that the fundamental frequency is in a range of 85 Hz to 255 Hz, considering that the audio data is a human sound, when it is determined that the fundamental frequency is out of the range of 85 Hz to 255 Hz, considering that the audio data is noise, and when it is determined that the sound frequency of the audio data is out of the range of 20 Hz to 20000 Hz, considering that the audio data is a blank sound.

According to a second aspect, an apparatus for adjusting volume of a user terminal is provided, including a collecting unit configured to collect a sound signal surrounding the user terminal, an analyzing unit configured to perform analysis on the collected sound signal, so as to obtain composition information of the sound signal, where the composition information includes sound types included in the sound signal and proportions of sounds of the various types, and the sound types include blank sound, human sound, and noise, a scene mode determining unit configured to determine a current scene mode of the user terminal according to the composition information of the sound signal, and a volume adjustment unit configured to adjust the volume of the user terminal according to the determined scene mode.

With reference to the second aspect, in a first possible implementation manner, the collecting unit is configured to collect, when it is detected that a call signal arrives, a sound signal of a current environment in which the user terminal is located, or periodically collect a sound signal of a current environment in which the user terminal is located.

With reference to the second aspect or the first possible implementation manner of the second aspect, in a second possible implementation manner, the volume adjustment unit is configured to determine a volume adjustment coefficient according to the determined scene mode and a pre-stored correspondence between scene modes and volume adjustment coefficients, and adjust the volume of the user terminal according to the volume adjustment coefficient.

With reference to the second possible implementation manner of the second aspect, in a third possible implementation manner, the volume of the user terminal includes ring tone volume and earpiece volume, the volume adjustment coefficient in the volume adjustment unit includes a ring tone volume adjustment coefficient and an earpiece volume adjustment coefficient, and the volume adjustment unit is configured to adjust the ring tone volume of the user terminal according to the ring tone volume adjustment coefficient, and adjust the earpiece volume of the user terminal according to the earpiece volume adjustment coefficient.

With reference to the second aspect, the first possible implementation manner of the second aspect, the second possible implementation manner of the second aspect, or the third possible implementation manner of the second aspect, in a fourth possible implementation manner, the apparatus further includes an acquiring unit configured to, after it is detected that the call signal is connected, acquire microphone volume of the user terminal in real time, and a comparing unit configured to compare magnitudes of the acquired microphone volume and pre-stored reference volume, where the volume adjustment unit is further configured to, when the acquired microphone volume is greater than the pre-stored reference volume, increase the earpiece volume of the user terminal, when the acquired microphone volume is less than the pre-stored reference volume, decrease the earpiece volume of the user terminal.

With reference to the fourth possible implementation manner of the second aspect, in a fifth possible implementation manner, the collecting unit is configured to, after it is detected that the call signal is connected, periodically collect the sound signal surrounding the user terminal, and the analyzing unit is further configured to perform analysis on the sound signal that is periodically collected by the collecting module after it is detected that the call signal is connected, so as to obtain the composition information of the sound signal, and determine, according to the composition information of the sound signal, whether the sound signal includes a human sound and includes a sound of only one person, if the sound signal includes a human sound and if the sound signal includes a human sound and includes the sound of the only one person a sound of only one person, calculate volume of the sound signal, obtain an average value of the calculated volume of the sound signal and the pre-stored reference volume, and store the average value as a new reference volume.

With reference to the second aspect, the first possible implementation manner of the second aspect, the second possible implementation manner of the second aspect, the third possible implementation manner of the second aspect, the fourth possible implementation manner of the second aspect, or the fifth possible implementation manner of the second aspect, in a sixth possible implementation manner, the analyzing unit includes a first processing unit configured to divide the collected sound signal into multiple pieces of audio data, a second processing unit configured to calculate a sound frequency of each piece of audio data, and classify, according to the calculated sound frequency, each piece of audio data according to blank sound, human sound, and noise, a third processing unit configured to collect statistics on proportions of blank sounds, human sounds, and noise in all pieces of audio data, and a fourth processing unit configured to for audio data distinguished as a human sound, calculate a mel-frequency cepstral coefficient, and collect statistics on audio data of a same mel-frequency cepstral coefficient as sounds of one person, so as to determine information about a quantity of people included in the human sound.

With reference to the sixth possible implementation manner of the second aspect, in a seventh possible implementation manner, the second processing unit is configured to determine whether the sound frequency of each piece of audio data is in a range of 20 Hz to 20000 Hz, when it is determined that the sound frequency of the audio data is in the range of 20 Hz to 20000 Hz, calculate a fundamental frequency of the audio data, when it is determined that the fundamental frequency is in a range of 85 Hz to 255 Hz, consider that the audio data is a human sound, when it is determined that the fundamental frequency is out of the range of 85 Hz to 255 Hz, consider that the audio data is noise, and when it is determined that the sound frequency of the audio data is out of the range of 20 Hz to 20000 Hz, consider that the audio data is a blank sound.

According to a third aspect, a terminal is provided, including a loudspeaker and an earpiece, and further including the foregoing volume adjustment apparatus according to the embodiments of the present disclosure.

The method and the apparatus for adjusting volume of a user terminal, and the terminal that are provided in the embodiments of the present disclosure have the following beneficial effects.

When a current scene mode of a user terminal is determined, because reference of composition information in a sound signal is added, a corresponding current scenario is closer to a real scenario, and can more precisely match a situation in which a user is located, thereby significantly reducing occurrence of a case, caused by a mistaken determination of the scenario, in which play volume adjustment does not conform to the scenario, and consequently enhancing user experience.

DESCRIPTION OF EMBODIMENTS

To resolve an existing problem that adjusted volume does not match a real scenario due to a low precision in identifying a scenario when a user terminal automatically adjusts volume according to a surrounding environment, a method and an apparatus for adjusting volume of a user terminal, and a terminal are provided in embodiments of the present disclosure, which can perform precise analysis on an environment sound so that a matched current scenario is closer to a real scenario, and proper volume is further obtained by means of adjustment, thereby significantly reducing occurrence of a case, caused by a mistaken determination of the scenario, in which volume adjustment does not conform to the scenario. The following clearly describes the technical solutions in the embodiments of the present disclosure with reference to the accompanying drawings in the embodiments of the present disclosure. The described embodiments are merely some but not all of the embodiments of the present disclosure. Other embodiments proposed by persons of ordinary skill in the art based on the embodiments of the present disclosure without creative efforts shall fall within the protection scope of the present disclosure.

The method for adjusting volume of a user terminal provided in the embodiments of the present disclosure may be mainly used for communication of communications terminals such as mobile phones or walkie-talkies. For example, when a call signal arrives, the mobile phone may not ring immediately, but may control proper ring tone volume after determining volume using the volume adjustment method provided in the embodiments of the present disclosure, and control proper earpiece volume after the call is connected. The volume adjustment method provided in the embodiments of the present disclosure may also be used by a mobile television terminal, for example, installed on a bus or a subway, to play a program. For example, a mobile television terminal on a bus may automatically adjust program volume according to a quantity of passengers and sound volume in the bus and using the volume adjustment method provided in the embodiments of the present disclosure.

Figure 1:
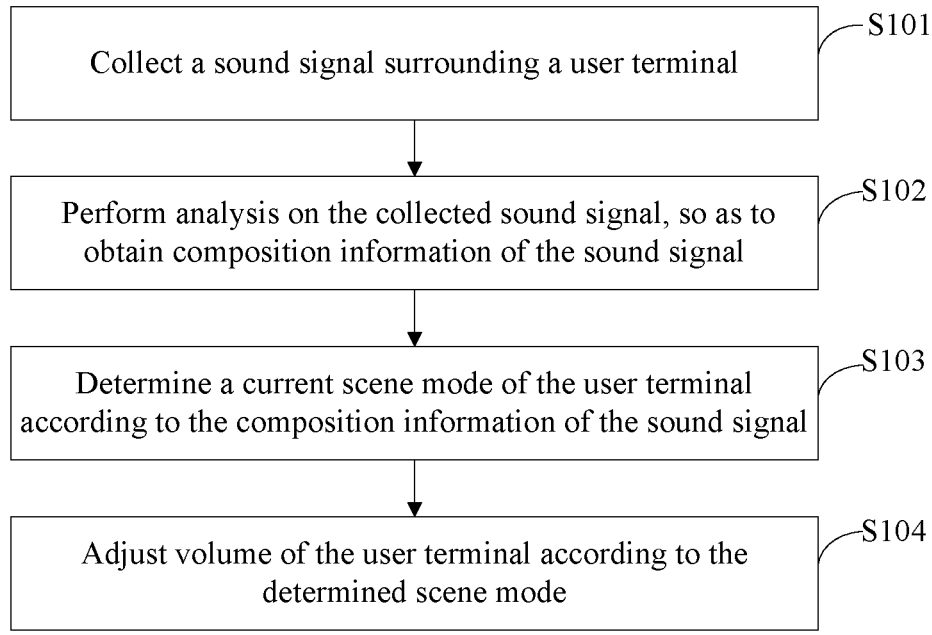
FIG. 1 is schematic flowchart 1 of a volume adjustment method according to an embodiment of the present disclosure.

Referring to FIG. 1, an embodiment of the present disclosure provides a method for adjusting volume of a user terminal, where the method includes the following steps.

S101. Collect a sound signal surrounding the user terminal.

In specific implementation, time to collect the sound signal may be controlled according to a processing capability of a device that performs volume adjustment. For example, when the processing capability of the device is relatively strong, a sound signal of a current environment in which the user terminal is located may be collected only when it is detected that a call signal arrives, and a subsequent procedure is performed, when the processing capability of the device is relatively weak, a sound signal of a current environment in which the user terminal is located may be periodically collected, and a subsequent procedure is performed. When the call signal arrives, a ring tone is played by directly using adjusted volume.

In specific implementation, the sound signal in the current environment may be collected using a component such as a microphone of the terminal, or a separate sound sensor may be configured in the terminal to collect the sound signal in the current environment, which is not limited herein.

S102. Perform analysis on the collected sound signal, so as to obtain composition information of the sound signal, where the composition information includes sound types included in the sound signal and proportions of sounds of the various types, and the sound types include blank sound, human sound, and noise.

In specific implementation, the sound signal may be divided into a blank sound, a human sound, and a non-human sound (noise), and the like. A blank sound refers to a sound signal that human ears cannot recognize. Generally, a sound signal with a sound frequency out of a range of 20 Hz to 20000 Hz may be considered as a blank sound. Noise refers to a sound signal that can be recognized by human ears other than a human sound. Generally, a sound signal with a sound frequency in a range of 20 Hz to 85 Hz and in a range of 255 Hz to 20000 Hz may be considered as noise. By performing analysis on the collected sound signal, a proportion of blank sounds, a proportion of noise, and a proportion of human sounds that are included in the sound signal are calculated, so as to perform subsequent scene mode identification.

S103. Determine a current scene mode of the user terminal according to the composition information of the sound signal.

The scene mode of the user terminal is used to indicate an environment situation in which the user terminal is located, for example, a quiet library, a conference room full of oral fights, a quiet bedroom, or a noisy road. In specific implementation, a corresponding scene mode correspondence is established with respect to a magnitude relationship among proportions of the three types of sounds in the sound signal, that is, different proportions of the sound signal correspond to different scene modes, and each scene mode corresponds to corresponding volume. Further, when the correspondence is established, reference of a quantity of human sounds may also be added, so that the corresponding scene mode is closer to a real environment, thereby significantly reducing occurrence of a case, caused by a mistaken determination of the environment, in which volume adjustment does not conform to the environment.

S104. Adjust the volume of the user terminal according to the determined scene mode.

In specific implementation, a volume adjustment coefficient may be determined according to the determined scene mode and a pre-stored correspondence between scene modes and volume adjustment coefficients, and the volume of the user terminal is adjusted according to the volume adjustment coefficient.

In specific implementation, when applied to a communications terminal such as a mobile phone, the volume of the user terminal may include ring (also referred to as ring tone) volume and earpiece volume, the volume adjustment coefficient may include two types, that is, a ring tone volume adjustment coefficient and an earpiece volume adjustment coefficient.

Correspondingly, the ring tone volume of the user terminal may be adjusted according to the ring tone volume adjustment coefficient, and the earpiece volume of the user terminal may be adjusted according to the earpiece volume adjustment coefficient.

Table 1 shows ring tone volume adjustment coefficients and earpiece volume adjustment coefficients that are set for different quantities of people in the following multiple scene modes. In each scenario, two values that are separated by a slash ("I") respectively indicate, from left to right, the ring tone volume adjustment coefficient and the earpiece volume adjustment coefficient.

It is assumed that volume adjustment is divided into ten levels, that is, from 0.1 to 1.0. An item with "d" indicates that the coefficient value further needs to be determined according to intensity (a decibels) of an environment sound, where d indicates an intensity level of environment volume. For example, a reasonable volume range that human ears can accept is 20 to 120 decibels (volume that is over 120 decibels is all calculated as 120), and the environment volume may also be divided into 10 levels according to a rule of one level being escalated for every 10 decibels, that is, a value range of d is 1, 2, . . . , 10. For some items with d, a calculation result may not precisely correspond to the ten values from 0.1 to 1.0, and then, a close and larger value is selected, if the calculation result is less than 0.1 or greater than 1.0, these two boundary values are selected.

TABLE 1

| | The proportion of blank sounds is far greater than that of other types | The proportion of human sounds is far greater than that of other types | The proportion of noise is far greater than that of other types | An integrated proportion of blank sounds and human sounds is relatively high | Other cases |
|---|---|---|---|---|---|
| The quantity of people <5 | 0.1/0.2 | 0.03 d/0.04 d | 0.1 d/0.1 d | 0.04 d/0.04 d | . . . |
| The quantity of people is 5-10 | 0.1/0.2 | 0.04 d/0.05 d | 0.1 d/0.1 d | 0.05 d/0.05 d | . . . |
| The quantity of people >10 | 0.1/0.3 | 0.05 d/0.06 d | 0.1 d/0.1 d | 0.06 d/0.06 d | . . . |

Figure 2:
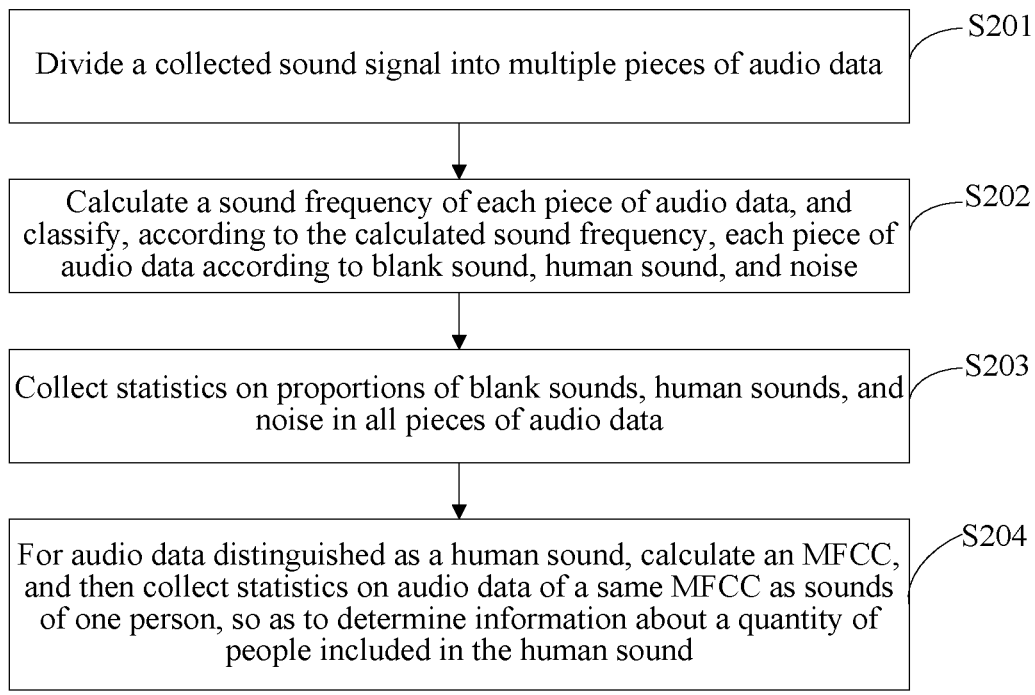
FIG. 2 is schematic flowchart 2 of a volume adjustment method according to an embodiment of the present disclosure.

In specific implementation, the foregoing step S102, provided in this embodiment of the present disclosure, of performing analysis on the collected sound signal, so as to obtain composition information of the sound signal, as shown in FIG. 2, may be implemented in the following manner.

S201. Divide the collected sound signal into multiple pieces of audio data, for example, n pieces: S1, S2, . . . , Sn.

S202. Calculate a sound frequency of each piece of audio data, and classify, according to the calculated sound frequency, each piece of audio data according to blank sound, human sound, and noise.

S203. Collect statistics on proportions of blank sounds, human sounds, and noise in all pieces of audio data. A quantity of pieces of audio data of each different type is separately calculated, and is compared with a quantity of all pieces of audio data to obtain a proportion.

S204. For audio data distinguished as a human sound, calculate a mel-frequency cepstral coefficient (MFCC), and then collect statistics on audio data of a same MFCC as sounds of one person, so as to determine information about a quantity of people included in the human sound.

For the audio data distinguished as a human sound, calculation of an MFCC feature may be performed, and then similarity between every two MFCC feature matrices is calculated. MFCC features with a similar result may be considered as sounds of one person, on the contrary, the MFCC features are sounds of different people, therefore, information about the quantity of people included in N samples may be obtained by means of statistics collection.

It may be understood that this embodiment of the present disclosure is mainly based on frequency and spectrum analysis, so as to determine the composition information of the collected sound signal. Other similar frequency/spectrum analysis methods can all implement the objective, which are not listed one by one herein.

Figure 3:
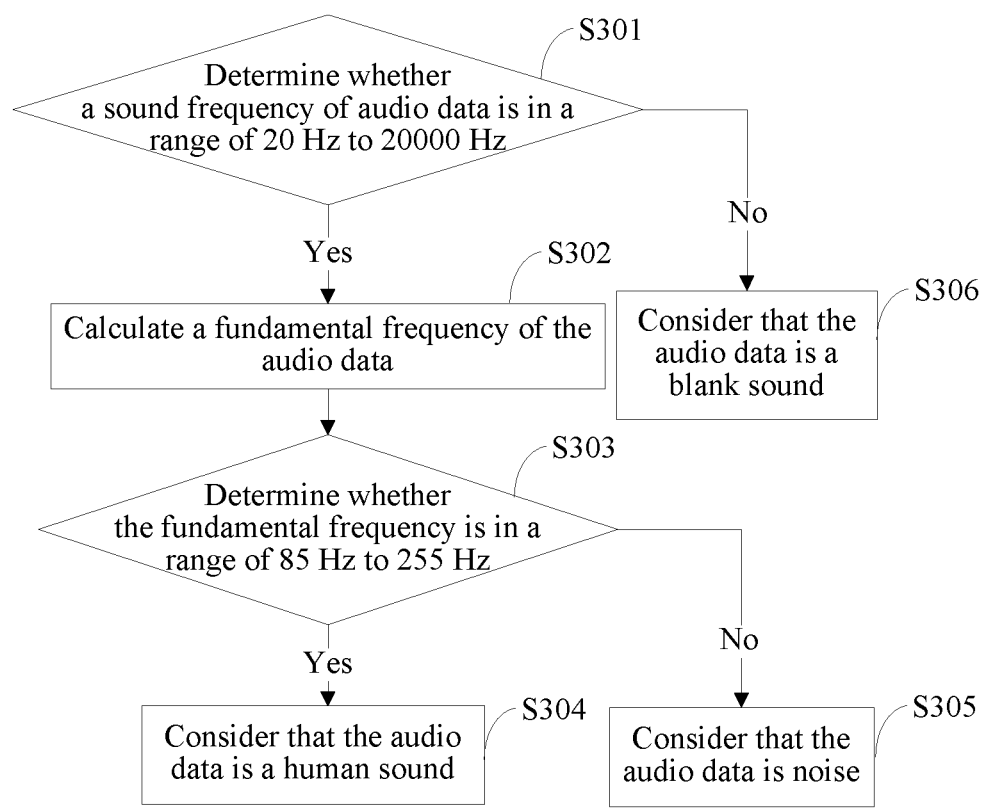
FIG. 3 is schematic flowchart 3 of a volume adjustment method according to an embodiment of the present disclosure.

The foregoing step S202 of classifying, according to the calculated sound frequency, each piece of audio data according to blank sound, human sound, and noise, as shown in FIG. 3, may be implemented using the following procedure.

S301. Determine whether the sound frequency of each piece of audio data is in a range of 20 Hz to 20000 Hz, if the sound frequency of each piece of audio data is in the range of 20 Hz to 20000 Hz, perform step S302, if the sound frequency of each piece of audio data is not in the range of 20 Hz to 20000 Hz, perform step S306.

S302. Calculate a fundamental frequency of the audio data. When a sounding body emits a sound because of vibration, the sound generally may be decomposed into multiple pure sine waves. That is, all nature sounds are basically formed by many sine waves of different frequencies, where a sine wave of a lowest frequency is the fundamental frequency (fundamental frequency), and the fundamental frequency may be used to distinguish different sounding bodies.

S303. Determine whether the fundamental frequency is in a range of 85 Hz to 255 Hz, if the fundamental frequency is in the range of 85 Hz to 255 Hz, perform step S304, if the fundamental frequency is not in the range of 85 Hz to 255 Hz, perform step S305.

S304. Consider that the audio data is a human sound.

S305. Consider that the audio data is noise.

S306. Consider that the audio data is a blank sound.

Further, after the foregoing step S104, provided in this embodiment of the present disclosure, of adjusting the volume of the user terminal according to the determined scene mode is performed, and after the user connects the call signal, during conversation, if the conversation proceeds without interference (in a quiet environment), intensity of a speech sound is generally fixed. Once a speaker considers that a surrounding environment is relatively noisy, the speaker subconsciously increases intensity of his speech sound, or, once the speaker considers that a current environment is very quiet (for example, previously multiple people were talking, and when one person answers a call, other people all stop talking), the person does not want the conversation sound to interfere with other people, or, once a conversation involves private information and a speaker does not want other people to hear content of the conversation, intensity of the speech sound is decreased compared with that in a normal case. For the foregoing cases, in the volume adjustment method provided in this embodiment of the present disclosure, after it is detected that the call signal is connected, a scheme for fine-tuning play volume for a second time is further provided, so as to achieve an effect that earpiece volume is adjusted to conform to a current situation.

Figure 4:
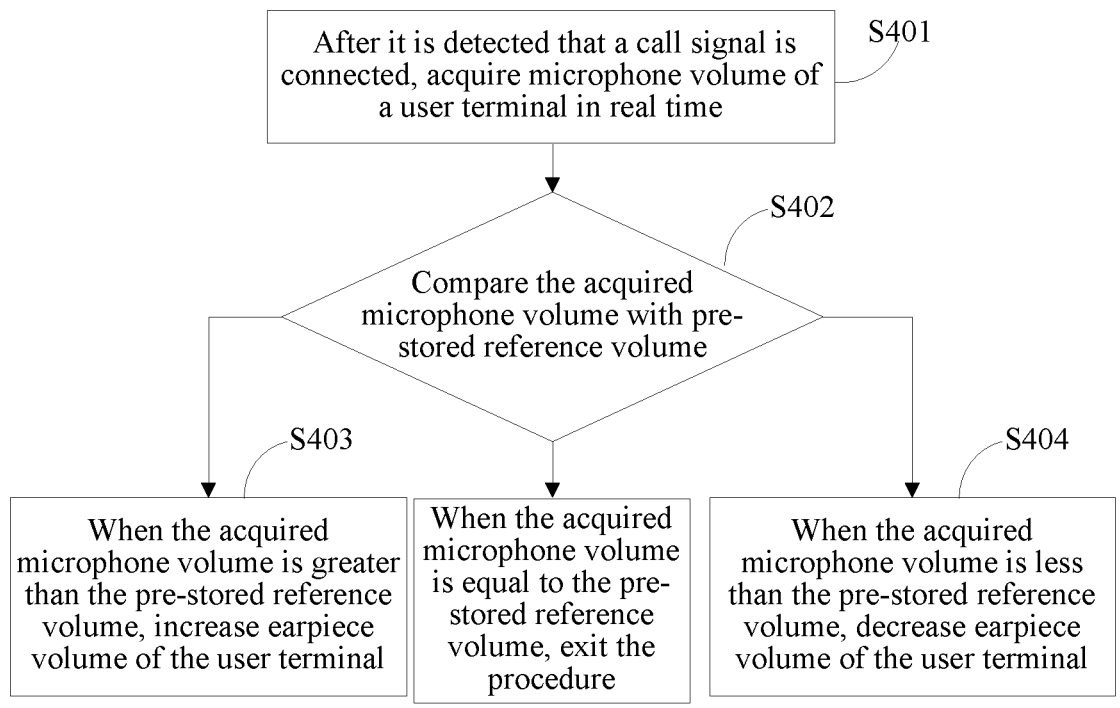
FIG. 4 is schematic flowchart 4 of a volume adjustment method according to an embodiment of the present disclosure.

Based on this, the foregoing volume adjustment method provided in this embodiment of the present disclosure, as shown in FIG. 4, further includes the following steps.

S401. After it is detected that the call signal is connected, acquire microphone volume of the user terminal in real time.

S402. Compare magnitudes of the acquired microphone volume and pre-stored reference volume, when the acquired microphone volume is greater than the pre-stored reference volume, perform step S403, when the acquired microphone volume is less than the pre-stored reference volume, perform step S404, when the acquired microphone volume is equal to the pre-stored reference volume, exit the procedure.

S403. Increase earpiece volume of the user terminal.

S404. Decrease the earpiece volume of the user terminal.

In specific implementation, when the acquired microphone volume is compared with the pre-stored reference volume in S402, the pre-stored reference volume may be set to a single numerical value, or may be set to a numerical value range. So long as the acquired microphone volume is in the value range, it may be considered that the acquired microphone volume is equal to the reference volume, and play volume of the earpiece does not need to be adjusted.

Figure 5:
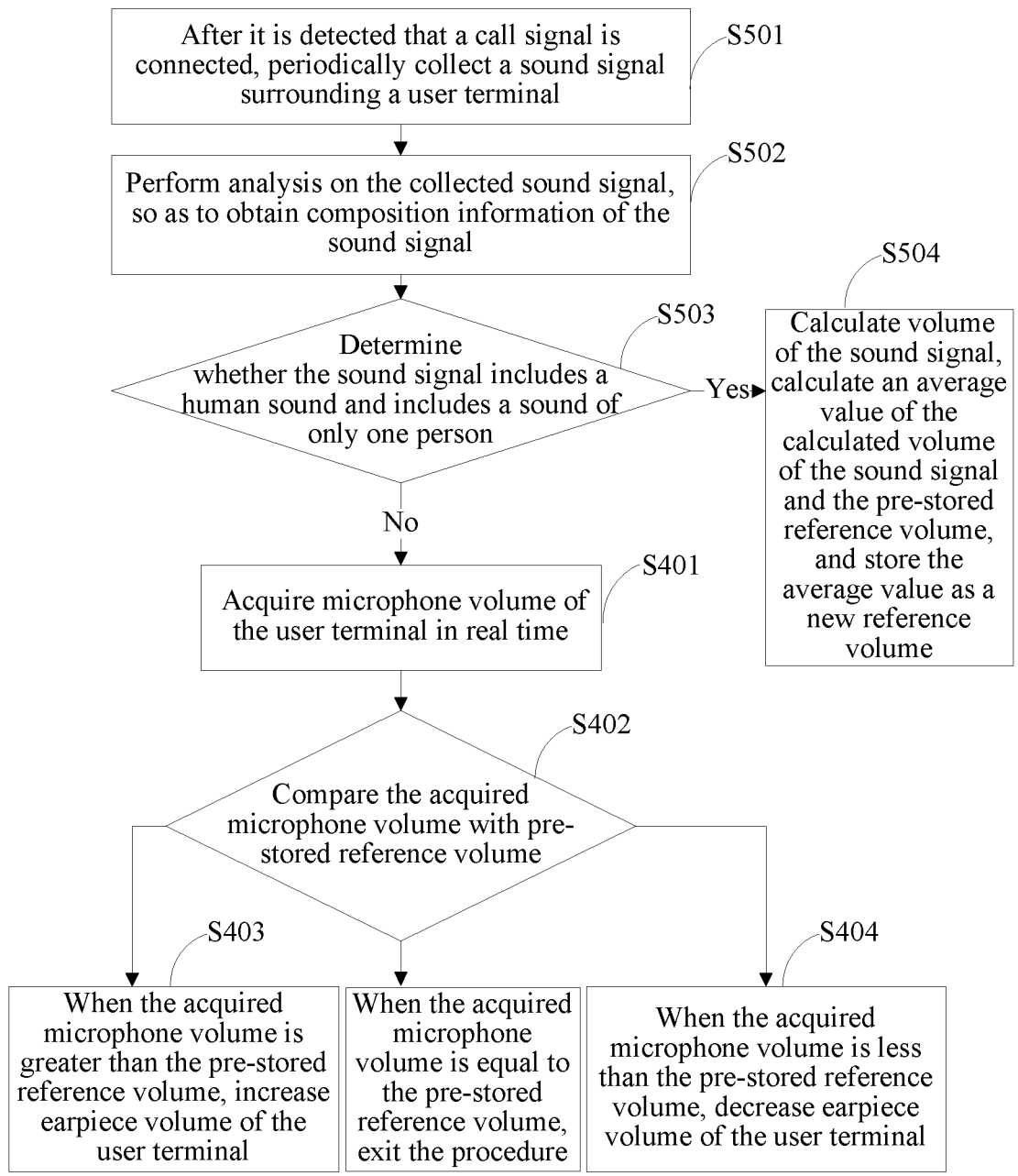
FIG. 5 is schematic flowchart 5 of a volume adjustment method according to an embodiment of the present disclosure.

Performing of the foregoing steps S401-S404 is implemented based on a pre-stored reference volume. The reference volume is generally a fixed value, and is determined and stored in a conversation process before the current conversation. Certainly, the reference volume may also be updated, as shown in FIG. 5, which may be implemented using the following steps.

S501. After it is detected that the call signal is connected, periodically collect the sound signal surrounding the user terminal.

S502. Perform analysis on the collected sound signal, so as to obtain the composition information of the sound signal, and in specific implementation, for specific performing steps, refer to steps S201-S204.

S503. Determine, according to the composition information of the sound signal, whether the sound signal includes a human sound and includes a sound of only one person, if the sound signal includes a human sound and if the sound signal includes a human sound and includes the sound of the only one person a sound of only one person, perform step S504, if the sound signal does not include a human sound and does not include a sound of only one person, perform the scheme for fine-tuning play volume for a second time, that is, perform steps S401-S404.

S504. Calculate volume of the sound signal, obtain an average value of the calculated volume of the sound signal and the pre-stored reference volume, and store the average value as a new reference volume.

In the foregoing volume adjustment method provided in this embodiment of the present disclosure, when a current scene mode of a user terminal is determined, because reference of composition information in a sound signal is added, a corresponding current scenario is closer to a real scenario, and can more precisely match a situation in which a user is located, thereby significantly reducing occurrence of a case, caused by a mistaken determination of the scenario, in which play volume adjustment does not conform to the scenario, and enhancing user experience.

Figure 6:
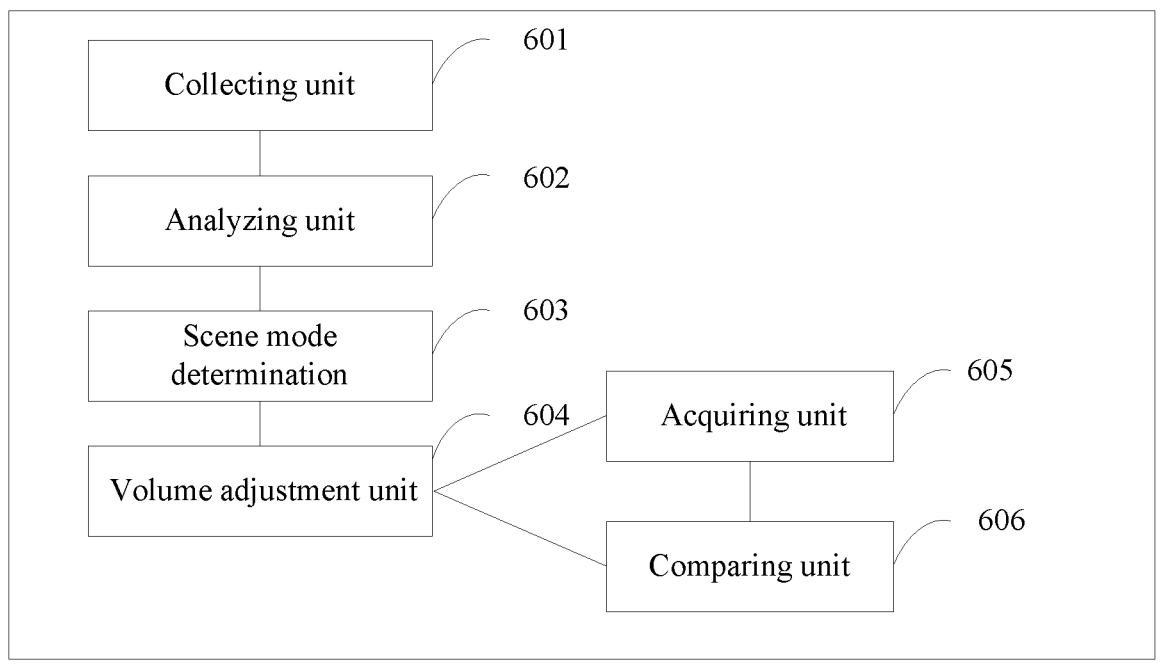
FIG. 6 is a schematic structural diagram of a volume adjustment apparatus according to an embodiment of the present disclosure.

Based on a similar concept, the present disclosure further provides an apparatus for adjusting volume of a user terminal, as shown in FIG. 6, including a collecting unit 601 configured to collect a sound signal surrounding the user terminal, an analyzing unit 602 configured to perform analysis on the collected sound signal, so as to obtain composition information of the sound signal, where the composition information includes sound types included in the sound signal and proportions of sounds of the various types, and the sound types include blank sound, human sound, and noise, a scene mode determining unit 603 configured to determine a current scene mode of the user terminal according to the composition information of the sound signal, and a volume adjustment unit 604 configured to adjust the volume of the user terminal according to the determined scene mode.

In the foregoing apparatus provided in this embodiment of the present disclosure, the collecting unit 601 is configured to collect, when it is detected that a call signal arrives, a sound signal of a current environment in which the user terminal is located, or periodically collect a sound signal of a current environment in which the user terminal is located.

In the foregoing apparatus provided in this embodiment of the present disclosure, the volume adjustment unit 604 is configured to determine a volume adjustment coefficient according to the determined scene mode and a pre-stored correspondence between scene modes and volume adjustment coefficients, and adjust the volume of the user terminal according to the volume adjustment coefficient.

In the foregoing apparatus provided in this embodiment of the present disclosure, the volume of the user terminal includes ring tone volume and earpiece volume, and the volume adjustment coefficient in the volume adjustment unit 604 includes a ring tone volume adjustment coefficient and an earpiece volume adjustment coefficient.

The volume adjustment unit 604 is configured to adjust the ring tone volume of the user terminal according to the ring tone volume adjustment coefficient, and adjust the earpiece volume of the user terminal according to the earpiece volume adjustment coefficient.

The foregoing apparatus provided in this embodiment of the present disclosure, as shown in FIG. 6, further includes an acquiring unit 605 configured to, after it is detected that the call signal is connected, acquire microphone volume of the user terminal in real time, and a comparing unit 606 configured to compare magnitudes of the acquired microphone volume and pre-stored reference volume, where the volume adjustment unit 604 is further configured to, when the acquired microphone volume is greater than the pre-stored reference volume, increase the earpiece volume of the user terminal, when the acquired microphone volume is less than the pre-stored reference volume, decrease the earpiece volume of the user terminal.

In the foregoing apparatus provided in this embodiment of the present disclosure, the collecting unit 601 is configured to, after it is detected that the call signal is connected, periodically collect the sound signal surrounding the user terminal.

The analyzing unit 602 is further configured to perform analysis on the sound signal that is periodically collected by the collecting module 601 after it is detected that the call signal is connected, so as to obtain the composition information of the sound signal, and determine, according to the composition information of the sound signal, whether the sound signal includes a human sound and includes a sound of only one person, if the sound signal includes a human sound and if the sound signal includes a human sound and includes the sound of the only one person a sound of only one person, calculate volume of the sound signal, obtain an average value of the calculated volume of the sound signal and the pre-stored reference volume, and store the average value as a new reference volume.

In the foregoing apparatus provided in this embodiment of the present disclosure, the analyzing unit 602 includes a first processing unit configured to divide the collected sound signal into multiple pieces of audio data, a second processing unit configured to calculate a sound frequency of each piece of audio data, and classify, according to the calculated sound frequency, each piece of audio data according to blank sound, human sound, and noise, a third processing unit configured to collect statistics on proportions of blank sounds, human sounds, and noise in all pieces of audio data, and a fourth processing unit configured to, for audio data distinguished as a human sound, calculate a mel-frequency cepstral coefficient, and collect statistics on audio data of a same mel-frequency cepstral coefficient as sounds of one person, so as to determine information about a quantity of people included in the human sound.

In the foregoing apparatus provided in this embodiment of the present disclosure, the second processing unit is configured to determine whether the sound frequency of each piece of audio data is in a range of 20 Hz to 20000 Hz, when it is determined that the sound frequency of the audio data is in the range of 20 Hz to 20000 Hz, calculate a fundamental frequency of the audio data, when it is determined that the fundamental frequency is in a range of 85 Hz to 255 Hz, consider that the audio data is a human sound, when it is determined that the fundamental frequency is out of the range of 85 Hz to 255 Hz, consider that the audio data is noise, and when it is determined that the sound frequency of the audio data is out of the range of 20 Hz to 20000 Hz, consider that the audio data is a blank sound.

According to the foregoing volume adjustment apparatus provided in this embodiment of the present disclosure, when a current scene mode of a user terminal is determined, because reference of composition information in a sound signal is added, a corresponding current scenario is closer to a real scenario, and can more precisely match a situation in which a user is located, thereby significantly reducing occurrence of a case, caused by a mistaken determination of the scenario, in which play volume adjustment does not conform to the scenario, and enhancing user experience.

Figure 7:
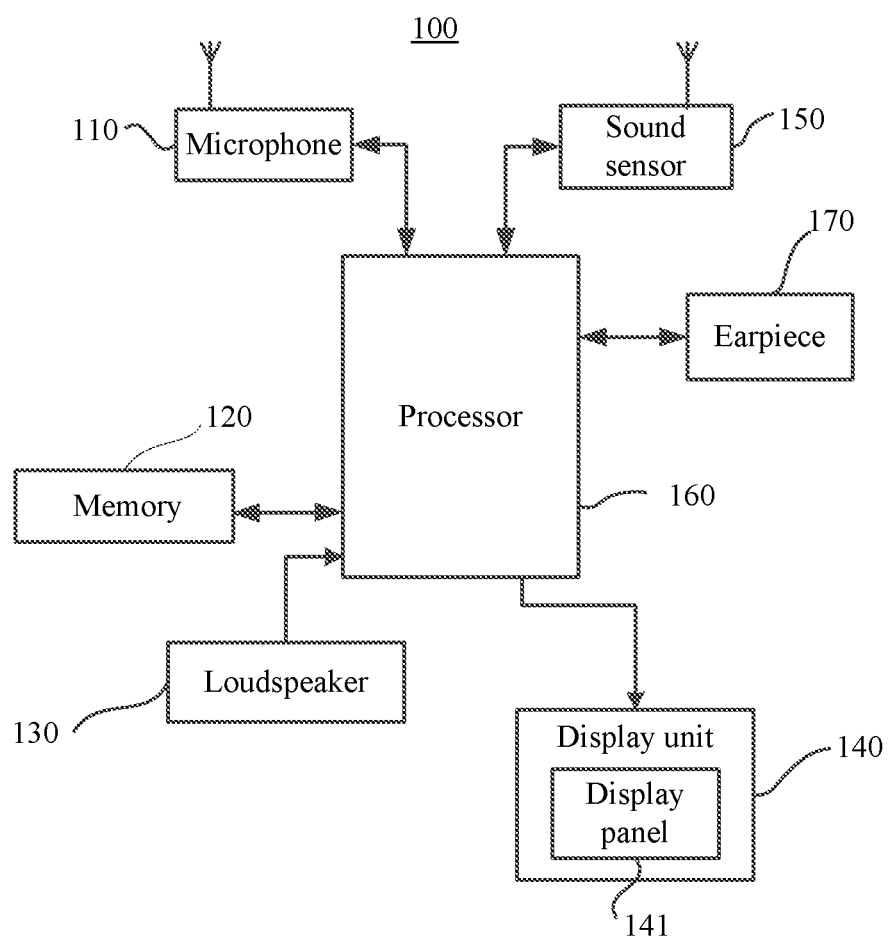
FIG. 7 is a schematic structural diagram of a user terminal according to an embodiment of the present disclosure.

Based on a similar concept, an embodiment of the present disclosure further provides a terminal, including a loudspeaker, an earpiece, and the foregoing volume adjustment apparatus provided in the embodiments of the present disclosure, where the volume adjustment apparatus is configured to adjust volume of the loudspeaker and volume of the earpiece. The terminal may be any product or component having a play function, such as a mobile phone, a walkie-talkie, a tablet computer, a television, a display, or a notebook computer. For implementation of the terminal, refer to the foregoing embodiments of the apparatus for controlling play volume, and repeated parts are not described herein again. An embodiment of the present disclosure provides another terminal, as shown in FIG. 7, including a sound sensor 150 configured to collect a sound signal surrounding a user terminal 100, a loudspeaker 130 configured to emit a ring tone for an incoming call when a call signal arrives at the user terminal 100, where it may be understood that the loudspeaker 130 may be further configured to play audio data such as music, and an earpiece 170 configured to play a voice of the other party when a user converses with the other party using the user terminal 100.

The terminal 100 may further include a display unit 140, where the display unit 140 may be configured to display information that is input by the user or information provided for the user, and various menu interfaces of the terminal 100. The display unit 140 may include a display panel 141, and optionally, the display panel 141 may be a liquid crystal display (LCD), an organic light-emitting diode (OLED), or the like.

In some implementation manners, a memory 120 stores an executable module or a data structure, or their subsets, or their extended sets.

In this embodiment of the present disclosure, by invoking a program or an instruction stored in the memory 120, a processor 160 is configured to perform analysis on the sound signal collected by the sound sensor 150, so as to obtain composition information of the sound signal, where the composition information includes sound types included in the sound signal and proportions of sounds of the various types, and the sound types include blank sound, human sound, and noise, determine a current scene mode of the user terminal according to the composition information of the sound signal, and adjust volume of the loudspeaker 130 and/or volume of the earpiece 170 according to the determined scene mode.

Optionally, as an embodiment, the sound sensor 150 acquires volume of a microphone 110 after it is detected that a call signal is connected.

The processor 160 is further configured to, when the acquired microphone volume is greater than pre-stored reference volume, increase earpiece volume of the user terminal, when the acquired microphone volume is less than the pre-stored reference volume, decrease the earpiece volume of the user terminal.

It should be noted that the sound sensor 150 is a unit configured to collect sound signals, and the sound sensor 150 may be integrated into the microphone 110, or may be a separate component, which is not limited in the present disclosure.

In addition, the terminal device 100 may further execute the method embodiments depicted in FIG. 1 to FIG. 5, and details are not described herein again in this embodiment of the present disclosure.

According to the foregoing user terminal provided in this embodiment of the present disclosure, when a current scene mode of a user terminal is determined, because reference of composition information in a sound signal is added, a corresponding current scenario is closer to a real scenario, and can more precisely match a situation in which a user is located, thereby significantly reducing occurrence of a case, caused by a mistaken determination of the scenario, in which play volume adjustment does not conform to the scenario, and enhancing user experience.

Based on the foregoing descriptions of the implementation manners, persons skilled in the art may clearly understand that the embodiments of the present disclosure may be implemented by hardware or by software in addition to a necessary general hardware platform. Based on such an understanding, the technical solutions in the embodiments of the present disclosure may be implemented in a form of a software product. The software product may be stored in a non-volatile storage medium (which may be a compact disc read-only memory (CD-ROM), a universal serial bus (USB) flash drive, a removable hard disk, or the like), and includes several instructions for instructing a computer device (which may be a personal computer, a server, a network device, or the like) to perform the methods described in the embodiments of the present disclosure.

Persons skilled in the art may understand that the accompanying drawings are merely schematic diagrams of exemplary embodiments, and modules or processes in the accompanying drawings are not necessarily required for implementing the present disclosure.

Persons skilled in the art may understand that the modules in the apparatuses provided in the embodiments may be arranged in the apparatuses in a distributed manner according to the description of the embodiments, or may be arranged in one or more apparatuses which are different from those described in the embodiments. The modules in the foregoing embodiments may be combined into one module, or split into a plurality of submodules.

The sequence numbers of the foregoing embodiments of the present disclosure are merely for illustrative purposes, and are not intended to indicate priorities of the embodiments.

Obviously, a person skilled in the art can make various modifications and variations to the present disclosure without departing from the spirit and scope of the present disclosure. The present disclosure is intended to cover these modifications and variations provided that they fall within the scope of protection defined by the following claims and their equivalent technologies.

What is claimed is:

1. A method for adjusting volume of a user terminal performed by the user terminal, comprising:
   collecting a sound signal of a current environment in which the user terminal is located;
   performing an analysis on the sound signal to obtain composition information of the sound signal, wherein the composition information comprises a plurality of sound types included in the sound signal and a proportion of each of the sound types included in the sound signal, and wherein the sound types comprise a blank sound, a human sound, and a noise;
   determining a current scene mode of the user terminal according to the composition information;
   determining a volume adjustment coefficient according to the current scene mode and a pre-stored correspondence between a plurality of scene nodes and a plurality of volume adjustment coefficients; and
   adjusting a volume of the user terminal according to the volume adjustment coefficient.

2. The method of claim 1, further comprising:
   detecting an arrival of a call signal; and
   further collecting the sound signal in response to detecting the arrival of the call signal.

3. The method of claim 1, further comprising periodically further collecting the sound signal.

4. The method of claim 1, wherein the volume comprises a ring tone volume and an earpiece volume, and wherein the volume adjustment coefficient comprises a ring tone volume adjustment coefficient and an earpiece volume adjustment coefficient.

5. The method of claim 4, further comprising:
   adjusting the ring tone volume of the user terminal according to the ring tone volume adjustment coefficient; and
   adjusting the earpiece volume of the user terminal according to the earpiece volume adjustment coefficient.

6. The method of claim 1, wherein after detecting a connection of a call signal, the method further comprises:
   acquiring a microphone volume of the user terminal in real time;
   increasing an earpiece volume of the user terminal when the microphone volume is greater than a pre-stored reference volume; and
   decreasing the earpiece volume of the user terminal when the microphone volume is less than the pre-stored reference volume.

7. The method of claim 6, wherein after detecting a connection of the call signal, the method further comprises:
   periodically collecting the sound signal;
   performing an analysis on the sound signal to obtain the composition information;
   determining, according to the composition information of, whether the sound signal comprises a human sound and a sound of only one person;

calculating a sound volume of the sound signal when the sound signal comprises the human sound and the sound of only one person;

obtaining an average value of the sound volume and the pre-stored reference volume; and storing the average value as a new reference volume.

8. The method of claim 1, further comprising:

dividing the sound signal into a plurality of pieces of audio data;

calculating a sound frequency of each of the pieces of audio data;

classifying, according to the sound frequency of each of the pieces of audio data, each piece of audio data according to the blank sound, the human sound, and the noise;

collecting statistics on proportions of the blank sound, the human sound, and the noise in all of the pieces of audio data;

calculating, for audio data distinguished as the human sound, a mel-frequency cepstral coefficient of audio data of the human sound; and collecting statistics on audio data of a same mel-frequency cepstral coefficient as sounds of one person to determine information about a quantity of people comprised in the human sound.

9. The method of claim 8, further comprising:

determining whether the sound frequency of each of the pieces of audio data is in a range of 20 hertz (Hz) to 20,000 Hz;

calculating a fundamental frequency of the audio data when the sound frequency of the audio data is in the range of 20 Hz to 20,000 Hz;

determining that the audio data is the human sound when the fundamental frequency is in a range of 85 Hz to 255 Hz;

determining that the audio data is the noise when the fundamental frequency is out of the range of 85 Hz to 255 Hz; and determining that the audio data is the blank sound when the sound frequency of the audio data is out of the range of 20 Hz to 20,000 Hz.

10. A user terminal, comprising:

a memory configured to store instructions; and a processor coupled to the memory and configured to execute the instructions, wherein the instructions cause the processor to be configured to:

collect a sound signal of a current environment in which the user terminal is located;

perform an analysis on the sound signal to obtain composition information of the sound signal, wherein the composition information comprises a plurality of sound types included in the sound signal and a proportion of each of the sound types included in the sound signal, and wherein the sound types comprise a blank sound, a human sound, and a noise;

determine a current scene mode of the user terminal according to the composition information;

determine a volume adjustment coefficient according to the current scene mode and a pre-stored correspondence between a plurality of scene modes and a plurality of volume adjustment coefficients: and adjust a volume of the user terminal according to the volume adjustment coefficient.

11. The terminal of claim 10, wherein the instructions further cause the processor to be configured to:

detect an arrival of a call signal; and further collect the sound signal in response to the arrival of the call signal.

12. The terminal of claim 10, wherein the instructions further cause the processor to be configured to periodically further collect the sound signal.

13. The terminal of claim 10, wherein the volume comprises a ring tone volume and an earpiece volume, and wherein the volume adjustment coefficient comprises a ring tone volume adjustment coefficient and an earpiece volume adjustment coefficient.

14. The terminal of claim 13, wherein the instructions further cause the processor to be configured to:

adjust the ring tone volume of the user terminal according to the ring tone volume adjustment coefficient; and adjust the earpiece volume of the user terminal according to the earpiece volume adjustment coefficient.

15. The terminal of claim 10, wherein after a call signal connection has been established, the instructions further cause the processor to be configured to:

acquire a microphone volume of the user terminal in real time;

increase an earpiece volume of the user terminal when the microphone volume is greater than a pre-stored reference volume; and decrease the earpiece volume of the user terminal when the microphone volume is less than the pre-stored reference volume.

16. The terminal of claim 15, wherein after the call signal connection has been established, the instructions further cause the processor to be further configured to:

periodically collect the sound signal;

perform an analysis on the sound signal to obtain the composition information;

determine, according to the composition information, whether the sound signal comprises a human sound and a sound of only one person;

calculate a sound volume of the sound signal when the sound signal comprises the human sound and the sound of only one person;

obtain an average value of the sound volume and the pre-stored reference volume; and store the average value as a new reference volume.

17. The terminal of claim 10, wherein the instructions further cause the processor to be configured to:

divide the sound signal into a plurality of pieces of audio data;

calculate a sound frequency of the pieces of audio data;

classify, according to the sound frequency of each of the pieces of audio data, each piece of audio data according to the blank sound, the human sound, and the noise;

collect statistics on proportions of the blank sound, the human sound, and the noise in all of the pieces of audio data;

calculate, for audio data distinguished as the human sound, a mel-frequency cepstral coefficient of audio data of the human sound; and collect statistics on audio data of a same mel-frequency cepstral coefficient as sounds of one person to determine information about a quantity of people comprised in the human sound.

18. A computer program product comprising instructions that are stored on a non-transitory computer-readable medium and that, when executed by a processor, cause a user terminal to:

collect a sound signal of a current environment in which the user terminal is located;

perform an analysis on the sound signal to obtain composition information of the sound signal, wherein the composition information comprises a plurality of sound types included in the sound signal and a proportion of each of the sound types included in the sound signal, and wherein the sound types comprise a blank sound, a human sound, and a noise;

determine a current scene mode of the user terminal according to the composition information of the sound signal;

determine a volume adjustment coefficient according to the current scene mode and a pre-stored correspondence between a plurality of scene modes and a plurality of volume adjustment coefficients; and adjust a volume of the user terminal according to the volume adjustment coefficient.

19. The computer program product of claim 18, wherein the instructions further cause the device to:

detect an arrival of a call signal; and further collect the sound signal in response to the arrival of the call signal.

20. The computer program product of claim 18, wherein the instructions further cause the device to periodically further collect the sound signal.

* * * * *

UNITED STATES PATENT AND TRADEMARK OFFICE
CERTIFICATE OF CORRECTION

PATENT NO. : 11,483,434 B2
APPLICATION NO. : 17/325918
DATED : October 25, 2022
INVENTOR(S) : Dong Liu It is certified that error appears in the above-identified patent and that said Letters Patent is hereby corrected as shown below:

In the Claims

Claim 1, Column 14, Line 29: "scene nodes and" should read "scene modes and"

Signed and Sealed this
Twenty-seventh Day of December, 2022

Katherine Kelly Vidal
*Director of the United States Patent and Trademark Office*